(12) United States Patent
Zeng et al.

(10) Patent No.: US 10,483,333 B2
(45) Date of Patent: Nov. 19, 2019

(54) TOUCH DISPLAY PANEL AND TOUCH DISPLAY APPARATUS

(71) Applicant: Shanghai Tianma Micro-Electronics Co., Ltd., Shanghai (CN)

(72) Inventors: Yang Zeng, Shanghai (CN); Xingyao Zhou, Shanghai (CN); Lihua Wang, Shanghai (CN); Qijun Yao, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 219 days.

(21) Appl. No.: 15/678,367

(22) Filed: Aug. 16, 2017

(65) Prior Publication Data

US 2018/0233541 A1     Aug. 16, 2018

(30) Foreign Application Priority Data

Feb. 15, 2017   (CN) .......................... 2017 1 0082312

(51) Int. Cl.
| | | |
|---|---|---|
| *G06F 3/041* | (2006.01) | |
| *H01L 27/32* | (2006.01) | |
| *G06F 3/044* | (2006.01) | |
| *H01L 51/52* | (2006.01) | |

(52) U.S. Cl.
CPC ............ *H01L 27/323* (2013.01); *G06F 3/044* (2013.01); *G06F 3/0412* (2013.01); *H01L 51/5246* (2013.01); *G06F 2203/04111* (2013.01); *G06F 2203/04112* (2013.01); *H01L 51/5253* (2013.01)

(58) Field of Classification Search
CPC . G06F 3/0412; H01L 51/5237; H01L 51/156; H01L 51/5221
USPC ......................................................... 257/40
See application file for complete search history.

*Primary Examiner* — Abdul-Samad A Adediran
(74) *Attorney, Agent, or Firm* — Miller, Matthias & Hull LLP

(57) ABSTRACT

A touch display panel and a touch display apparatus are provided. The touch display panel includes: a substrate; an organic light emitting device; at least one retaining wall, the width of which is 30~200 μm; a thin film encapsulation layer covering the retaining wall, and a height difference between a first retaining wall and a part of the thin film encapsulation layer located between the first retaining wall and a display area is 0~3 μm; and electrode wires, at least a part of at least one of the electrode wires is located at least in non-display areas of the substrate, is located at a side, which is facing away from the retaining wall, of the thin film encapsulation layer, and is arranged along an extension direction of the retaining wall, and projections of the electrode wires on the substrate are located within a projection of the retaining wall on the substrate.

20 Claims, 8 Drawing Sheets

TOUCH DISPLAY PANEL AND TOUCH DISPLAY APPARATUS

CROSS-REFERENCE TO RELATED APPLICATIONS

This application claims priority to a Chinese patent application No. 201710082312.5 filed on Feb. 15, 2017, the disclosure of which is incorporated herein by reference in its entirety.

TECHNICAL FIELD

The present disclosure relates to the field of touch displays, and in particular relates to a touch display panel and a touch display apparatus including the touch display panel.

BACKGROUND

With an increasing development of mobile terminal technologies, a display screen with a touch function has gradually become a popular screen for various mobile terminals. A technical principle of a touch panel is as follows: voltage, current, sound waves or infrared rays and the like are detected according to different induction manners when a finger or other media touch the screen, so that a coordinate position of a touch point is detected.

FIG. 1 is a schematic diagram illustrating a structure of a touch display panel of the existing art, and FIG. 2 is a schematic top diagram illustrating a structure of the touch display panel of the existing art. The touch display panel includes a substrate 10', a light emitting device 20', a thin film encapsulation layer 30', a retaining wall 40', a plurality of touch electrodes 50' and touch electrode wires 60'. In order to ensure a touch performance at an edge, the touch electrodes 50' generally need to exceed about 0.5 mm relative to a display area A'. Therefore, together with the width of the touch electrode wires 60', a border needs to be very wide if all the touch electrodes 50' are formed on the thin film encapsulation layer 30' for the retaining wall 40' and the display area A'. The touch electrode wires 60' need to have a larger height difference h2' if the touch electrode wire 60' crosses a first retaining wall 41' and is made between the first retaining wall 41' and a second retaining wall 42', causing breaking of the touch electrode wires 60' easily and being not beneficial to the preparation.

SUMMARY

In view of this, the present disclosure provides a touch display panel and a touch display apparatus including the touch display panel.

In a first aspect, the present disclosure provides a touch display panel, including:

a substrate comprising a display area and non-display areas;

an organic light emitting device formed in the display area of the substrate;

at least one retaining wall arranged in the non-display area of the substrate, where the at least one retaining wall includes a first retaining wall which is adjacent to the display area, and a width of the at least one retaining wall is 30 µm~200 µm;

a thin film encapsulation layer, where the thin film encapsulation layer is arranged at a side, which is facing away from the substrate, of the organic light emitting device, and the thin film encapsulation layer includes at least one inorganic encapsulation layer and at least one organic encapsulation layer, and the thin film encapsulation layer covers the at least one retaining wall, a height difference between the first retaining wall and a part of the thin film encapsulation layer located between the first retaining wall and the display area is 0 µm~3 µm;

touch electrodes, where the touch electrodes are arranged at a side, which is facing away from the substrate, of the thin film encapsulation layer, and at least a part of at least one of the touch electrodes is located in the display area of the substrate; and electrode wires, where at least a part of at least one of the electrode wires is located in the non-display area of the substrate, is disposed at a side, which is facing away from the retaining wall, of the thin film encapsulation layer, and is arranged along an extension direction of the at least one retaining wall, where projections of the electrode wires on the substrate are located within a projection of the at least one retaining wall on the substrate.

In a second aspect, the present disclosure further provides a touch display apparatus including the touch display panel described in the first aspect.

Compared with the existing art, in the present disclosure, the width of at least one retaining wall is set as 30~200 µm, the height difference between the retaining wall 40 and a part of the thin film encapsulation layer 30 located between the first retaining wall 41 and the display area A is 0~3 µm, so that at least a part of at least one of the electrode wires is arranged at a side, which is facing away from the retaining wall, of the thin film encapsulation layer, and is arranged along the extension direction of the retaining wall, and the projections of the electrode wires on the substrate are located within the projection of the retaining wall on the substrate, so as to fully utilize a border area of the area where the retaining wall is located and reduce a border area where the electrode wires are individually placed, thereby realizing a narrow border and alleviating the risks of wire breaking and short circuit.

DETAILED DESCRIPTION

Figure 1:
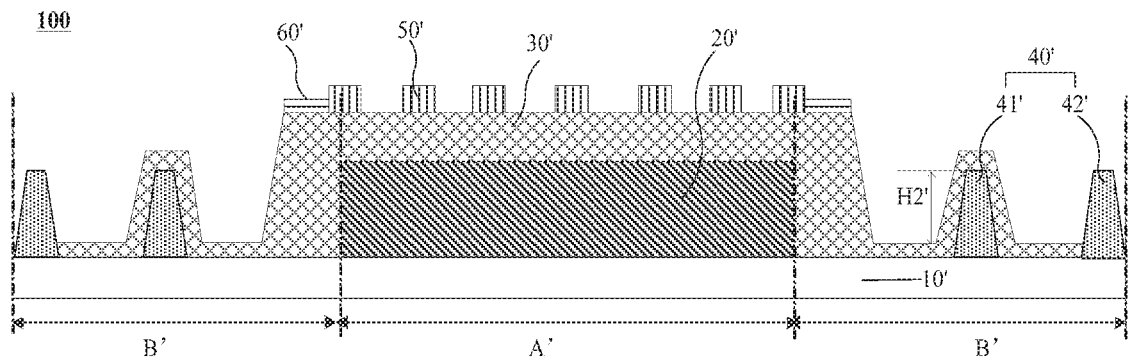
FIG. 1 is a schematic diagram illustrating a sectional structure of a touch display panel in the existing art.
Figure 2:
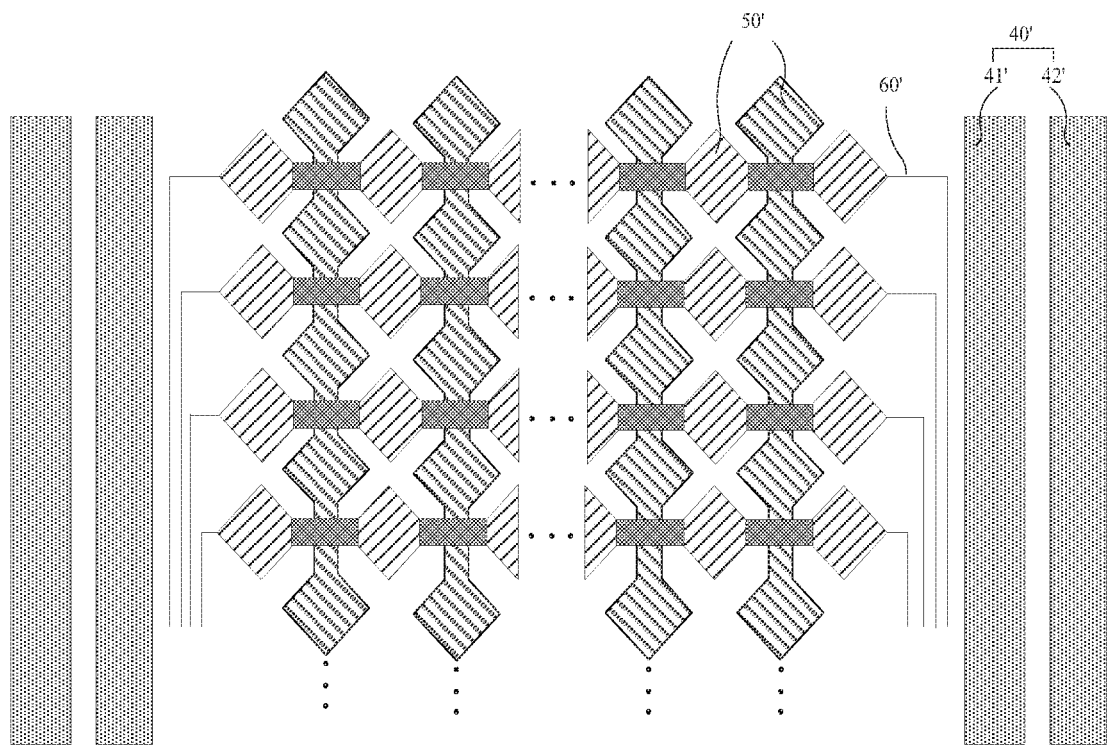
FIG. 2 is a schematic top diagram illustrating a structure of a touch display panel in the existing art.

In order that the above purposes, features and advantages of the present disclosure can be more clearly and easily understood, the present disclosure is further described below in combination with drawings and embodiments. However, exemplary implementation manners can be implemented in various forms and should not be understood as a limit to the implementation manners illustrated herein; contrarily, the implementation manners are provided, so that the present disclosure can be more comprehensive and more complete, and the conceptions of the exemplary implementation manners can be comprehensively conveyed to those skilled in the art. Same reference numerals in the drawings represent same or similar structures, and therefore, repeated descriptions of the same or similar structures are omitted. Words for expressing positions and directions, which are described in the present disclosure, are all the descriptions with the drawings as examples; however, the words can also be changed as required; and any change made shall be included in the protection scope of the present disclosure. The drawings of the present disclosure are only used for expressing relative position relationships, the layer thickness of some parts adopts an ostentatious drawing manner, so as to facilitate understanding, and the layer thickness in the drawings does not represent a proportion relationship of the actual layer thickness.

It should be noted that, concrete details are illustrated in the following description in order to fully understand the present disclosure. However, the present disclosure can be implemented in various other manners different from the manners described herein, and those skilled in the art can make similar popularization without departing from the connotation of the present disclosure. Therefore, the present disclosure is not limited by specific implementation manners disclosed below. For example, some vocabularies in the specification and the claims are used for referring to a specific component. Those skilled in the art should understand that, hardware manufacturers possibly use different nouns to call a same component. In the specification and the claims, the differences of names are not served as a manner of distinguishing components, but functional differences of the components are served as a criterion of distinguishing the components. For example, 'including' mentioned in the entire specification and claims is an open type expression. Therefore, the 'including' is explained as 'including but not limited to'. It should be noted that, for example, a component is located at 'one side' of another component, which is mentioned in the entire specification and claims, includes a situation that the component and another component are adjacent or are not adjacent. For example, a component is located 'on' another component, which is mentioned in the entire specification and claims, includes a situation that the component and another component are adjacent or are not adjacent. The subsequent descriptions of the specification are preferred implementation manners of implementing the present application; however, the descriptions are intended to describe a general principle of the present application and are not used for limiting the scope of the present disclosure. The protection scope of the present application is defined by claims.

It should be noted that, concrete details are illustrated in the following description in order to fully understand the present disclosure. However, the present disclosure can be implemented in various other manners different from the manners described herein, and those skilled in the art can make similar popularization without departing from the connotation of the present disclosure. Therefore, the present disclosure is not limited by specific implementation manners disclosed below.

Figure 3:
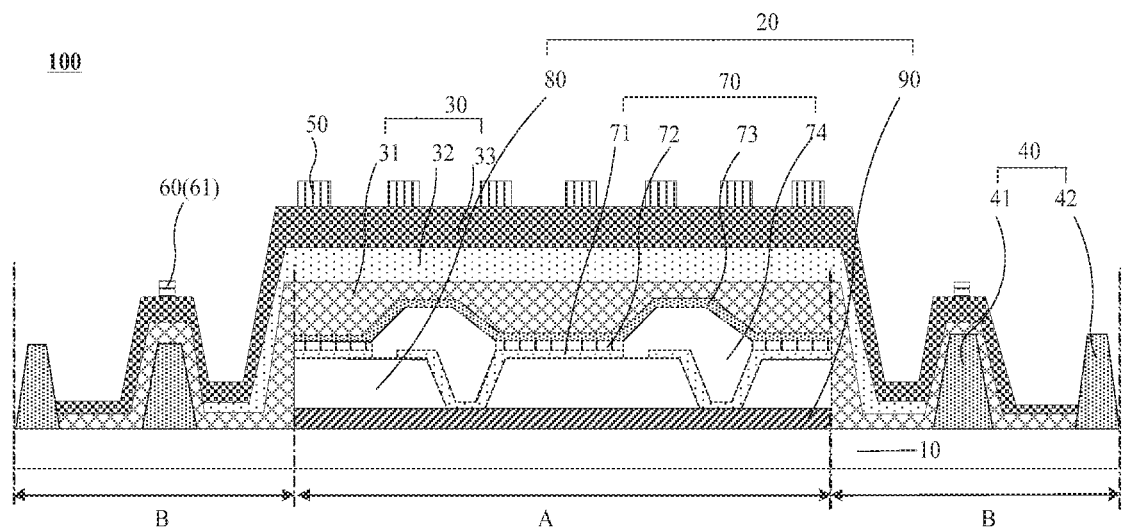
FIG. 3 is a schematic diagram illustrating a sectional structure of a touch display panel provided by embodiments of the present disclosure.
Figure 4:
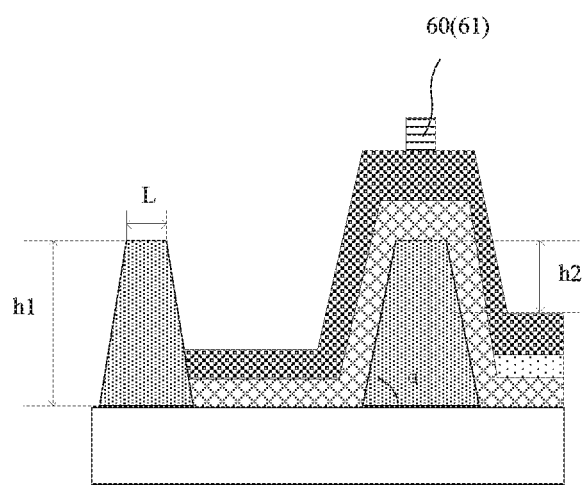
FIG. 4 is an enlarged schematic diagram illustrating a non-display area in FIG. 3.

With reference to FIG. 3 and FIG. 4, FIG. 3 is a schematic diagram illustrating a sectional structure of a touch display panel provided by an embodiment of the present disclosure, and FIG. 4 is an enlarged schematic diagram illustrating a non-display area in FIG. 3. A touch display panel 100 includes a substrate 10 including a display area A and non-display areas B; an organic light emitting device 20 formed in the display area A of the substrate 10; at least one retaining wall 40, arranged in the non-display areas B of the substrate 10, the at least one retaining wall including a first retaining wall 41 adjacent to the display area A, a width of the at least one retaining wall 40 is 30~200 μm, and as shown in FIG. 4, the width can be a width of an upper bottom (L); a thin film encapsulation layer 30, arranged at a side, which is facing away from the substrate 10, of the organic light emitting device 20, and the thin film encapsulation layer 30 including at least one inorganic encapsulation layer and at least one organic encapsulation layer and covers the at least one retaining wall 40, a height difference h2 between the first retaining wall 41 and a part of the thin film encapsulation layer 30 located between the first retaining wall 41 and the display area A is 0~3 μm; touch electrodes 50, the touch electrodes 50 are arranged at a side, which is facing away from the substrate 10, of the thin film encapsulation layer 30, and at least a part of at least one of the touch electrodes is located in the display area A of the substrate 10; and electrode wires 60, at least a part of at least one of the electrode wires is arranged in the non-display areas B of the substrate 10, is located at a side, which is facing away from the retaining wall 40, of the thin film encapsulation layer 30, and is arranged along an extension direction of the retaining wall 40, and projections of the electrode wires 60 on the substrate 10 being located in a projection of the retaining wall 40 on the substrate 10. According to the present embodiment of the present disclosure, the width of at least one retaining wall 40 is set as 30~200 μm, so that at least a part of at least one of the electrode wires 60 is arranged at the side, which is facing away from the retaining wall 40, of the thin film encapsulation layer 30, and is arranged along the extension direction of the retaining wall 40, and the projections of the electrode wires 60 on the substrate 10 are located in the projection of the retaining wall 40 on the substrate 10. Therefore, the border area is fully utilized, the width that the electrode wires are individually placed is reduced, and thus a narrow border is realized. The height difference h2 between the retaining wall 40 and a part of the thin film encapsulation layer 30 located between the first retaining wall 41 and the display area A is 0~3 μm, thereby reducing the risk of breaking of the electrode wires caused by climbing.

Optionally, the substrate 10 is a flexible substrate which, in conjunction with the organic light emitting device 20 and the thin film encapsulation layer 30, forms a flexible display panel. A material of the flexible substrate is not limited by the present disclosure, optionally, the material of the flexible substrate is an organic polymer. For example, the organic polymer may be one of PI (Polyimide), PA (Polyamide), PC (Polycarbonate), PES (Polyether Sulphone), PET (Polyethylene Terephthalate), PEN (Polyethylene Naphthalene), PMMA (Polymethyl Methacrylate) and COC (Cycloolefin Copolymer).

In an embodiment of the present disclosure, the organic light emitting device 20 is arranged in the display area A of the substrate 10. At a side toward the thin film encapsulation layer 30 of the substrate 10, the organic light emitting device 20 sequentially includes a planarization layer, a thin film transistor layer and a device layer 70. The device layer 70 includes at least an anode layer 71, a light emitting layer 72 and a cathode layer 73, and may further include one or more of a hole injection layer, a hole transport layer, an electron blocking layer, a hole blocking layer, an electron transport layer and an electron injection layer. The device layer 70 may further include a pixel definition layer 74 through which the light emitting layer 72 is defined into a plurality of sub-pixel areas. The light emitting layer 72 may be a red light emitting layer, a green light emitting layer or a blue light emitting layer. The light emitting layer 72 may be a single white light emitting layer. The light emitting layer 72 may be a stacked structure of the red light emitting layer, the green light emitting layer and/or the blue light emitting layer. A color filter (not shown) may be included when the light emitting layer 72 has the stacked structure. The hole injection layer and/or the hole transport layer may be arranged between the anode layer 71 and the light emitting layer 72. The electron injection layer and/or the electron transport layer may be arranged between the cathode layer 73 and the light emitting layer 72. The hole injection layer, the hole transport layer, the electron transport layer and the electron injection layer may be formed on the whole display area A of the substrate 10. The structure and material of the device layer 70 may adopt a known technology, which is omitted herein.

Further, the organic light emitting device 20 further includes the thin film transistor layer 90, a metal layer including a plurality of data lines (not shown) and a metal layer including a plurality of scanning lines (not shown) that are required for realizing display. The thin film transistor layer 90 includes at least an active layer, a source, a drain, a gate and an insulating layer. The drain of the thin film transistor layer 90 is electrically connected with the anode layer 71 of the device layer 70. The metal layer including the data lines and the metal layer including the scanning lines are intersected, the metal layer including the data lines is electrically connected with the source of the thin film transistor layer 90, and the metal layer including the scanning lines is electrically connected with the gate of the thin film transistor layer 90. During operation, the metal layer including the scanning lines controls the turning on or off of each sub-pixel through the gate of the thin film transistor layer 90; the metal layer including the data lines is electrically connected with the anode layer 71 of the device layer 70 through the source of the thin film transistor layer 90, so as to provide the data signal to each sub-pixel to control the display of each sub-pixel when a thin film transistor corresponding to the sub-pixel is turned on. A specific structure of the thin film transistor layer 90 may adopt a known technology, which is omitted herein.

Further, the organic light emitting device 20 further includes the planarization layer 80 arranged on the thin film transistor layer 90, and the anode layer 71 of the device layer 70 is arranged on the planarization layer 80 and is electrically connected with the drain of the thin film transistor layer 90 through a via hole in the planarization layer 80. The thin film encapsulation layer 30 is arranged at the side, which is facing away from the substrate 10, of the organic light emitting device 20. Further, the thin film encapsulation layer 30 includes at least one inorganic encapsulation layer and at least one organic encapsulation layer, and covers at least one retaining wall 40. The height difference h2 between the retaining wall 40 and a part of the thin film encapsulation layer 30 located between the first retaining wall 41 and the display area A is 0~3 μm. In the embodiment of the present disclosure, in the non-display areas, at least a part of at least one of the electrode wires 60 is located at the side, which is facing away from the retaining wall 40, of the thin film encapsulation layer, namely, the projections of the retaining wall 40, the thin film encapsulation layer 30 and the electrode wires 60 on the substrate 10 are at least partially overlapped.

Optionally, the thin film encapsulation layer 30 includes at least one inorganic encapsulation layer and at least one organic encapsulation layer. The material of the organic encapsulation layer may include a polymer, such as a single layer or a stacked layer formed by PET, PI, PC, epoxy resin, polyethylene, polyacrylate and organo-siloxane. The inorganic encapsulation layer may be a single layer or a stacked layer including metallic oxide or metal nitride. For example, the inorganic encapsulation layer may include any one of $SiN_x$, $Al_2O_3$, $SiO_2$ and $TiO_2$.

Optionally, with reference to FIG. 3, in order to facilitate description, on the side, which is facing away from the substrate 10, of the organic light emitting device 20, the embodiment of the present disclosure includes a first inorganic encapsulation layer 31, an organic encapsulation layer 32, a second inorganic encapsulation layer 33 sequentially, a first retaining wall 41 and a second retaining wall 42. The first retaining wall 41 is used for limiting a boundary of the organic encapsulation layer 32, so that the organic encapsulation layer 32 does not exceed the first retaining wall, and the border is reduced. The second retaining wall 42 is used for preventing an expansion of a crack. The first inorganic encapsulation layer 31 and the second inorganic encapsulation layer 33 cross the first retaining wall 41, so as to further improve the water oxygen blocking effects of the border area and prevent water and oxygen from penetrating from the side surface to cause an influence on light emitting performance of the organic light emitting device 20. In the embodiment of the present disclosure, a part of the electrode wires 60 or all the electrode wires 60 may be arranged at the side, which is facing away from the substrate 10, of the first retaining wall 41, and are located at a side, which is facing away from the retaining wall, of the second inorganic encapsulation layer 33, namely, the protections of the retaining wall 40, the second inorganic encapsulation layer 33 and the touch electrode wires 60 on the substrate are at least partially overlapped, thereby fully utilizing the width of the border area to realize a narrow border.

Optionally, with reference to FIG. 4, FIG. 4 is an enlarged schematic diagram illustrating the non-display area in FIG. 3. In order to realize the narrow border and avoid the phenomenon of wire breaking caused by arranging the electrode wire 60 on the retaining wall 40, through a large amount of experiments, the inventor found that the width L of the retaining wall 40 may be 30~200 μm, so that a part or all of the electrode wires 60 are arranged on the retaining wall 40. Optionally, the width L of the retaining wall may be 60~70 μm, and at least a part of the electrode wires 60 are arranged on the retaining wall 40, so as to achieve the narrow border. Optionally, the height h1 of the retaining wall 40 may be 4~6 μm, so that the electrode wires 60 may better cross the retaining wall 40 without breaking. Optionally, the height difference h2 between the retaining wall 40 and a part of the thin film encapsulation layer 30 located between the first retaining wall 41 and the display area A is 0~3 μm, thereby reducing the climbing obstruction of the electrode wires 60. Through preparing a touch display panel having the height difference h2 of 2 μm, 3 μm and 5 μm respectively, the inventor found that the touch electrode wires may be well located at the climbing positions of the retaining wall without the phenomena of short circuit and breaking when the height difference h2 is 2 μm; a rate of successful climbing can reach 90% when the height difference is 3 μm; and the short circuit may occur at the climbing positions at a probability of 90% when the height difference h2 is 5 μm. Optionally, in the embodiment of the present disclosure, the height difference h2 between the retaining wall 40 and a part of the thin film encapsulation layer 30 located between the first retaining wall 41 and the display area A is set as 0~3 μm. Optionally, the height difference h2 can be set as 0~2 μm by those skilled in the art according to actual needs. Optionally, an inclination angle α of the retaining wall 40 may be in a range of 10~30 degrees, which causes the electrode wires to be well arranged on the retaining wall 40, and no wire breaking is caused. Therefore, the rate of successful climbing is higher, a limitation function on the organic encapsulation layer can be better kept, and the crack expansion on the boundary can be well prevented.

Optionally, the electrode wires 60 may include touch electrode wires 61. At least a part of at least one of the touch electrode wires 61 is located in the non-display areas B of the substrate 10, and the touch electrode wires 61 are connected with the touch electrodes 50.

Optionally, the electrode wires 60 may further include grounding wires 62. At least a part of the grounding wires 62 are arranged at the side, which is facing away from the substrate 10, of the thin film encapsulation layer 30, and are arranged along the extension direction of the retaining wall 40. Projections of the grounding wires 62 on the substrate 10 are located in the projection of the retaining wall 40 on the substrate 10, thereby reducing the border area in which the grounding wires are individually arranged to realize the narrow border.

Figure 5:
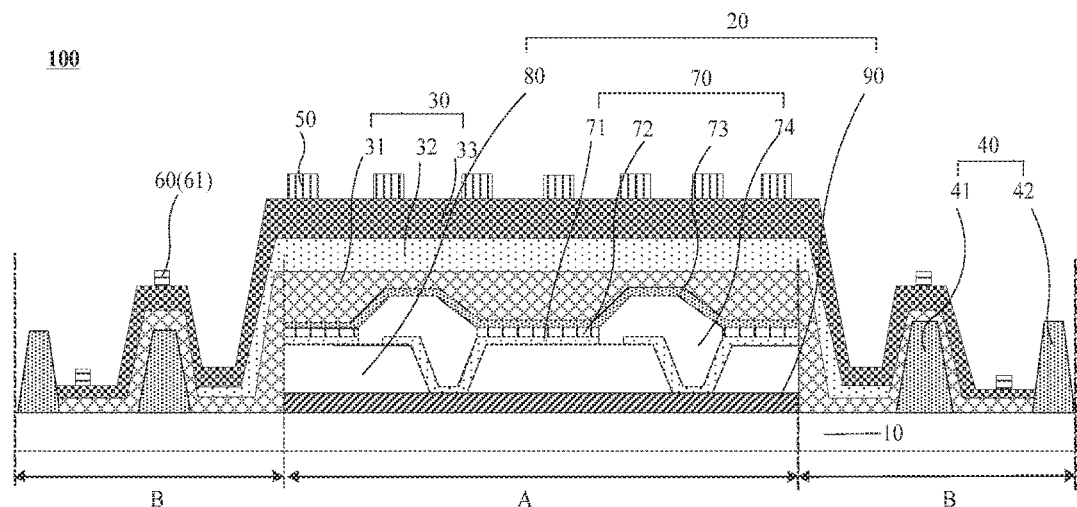
FIG. 5 is a schematic diagram illustrating a sectional structure of another touch display panel provided by embodiments of the present disclosure.

Optionally, with reference to FIG. 5, FIG. 5 is a schematic diagram illustrating a sectional structure of another touch display panel provided by an embodiment of the present disclosure. In the present embodiment, the electrode wires 60 may also be arranged between two retaining walls so as to fully utilize the width of the border area. In order to facilitate description, optionally, the present embodiment may include two retaining walls 40 including a first retaining wall 41 and a second retaining wall 42, and the electrode wires 60 may also be arranged between the first retaining wall 41 and the second retaining wall 42, so as to achieve the narrow border. Optionally, in the present embodiment, a plurality of electrode wires 60 may be arranged between the two retaining walls, and the number of the electrode wires is not limited by the present embodiment and can be set by those skilled in the art as required. Optionally, the process of preparing the touch display panel is easier, and the preparation precision of the electrode wires is higher when the electrode wires 60 are arranged between two retaining walls.

Figure 6:
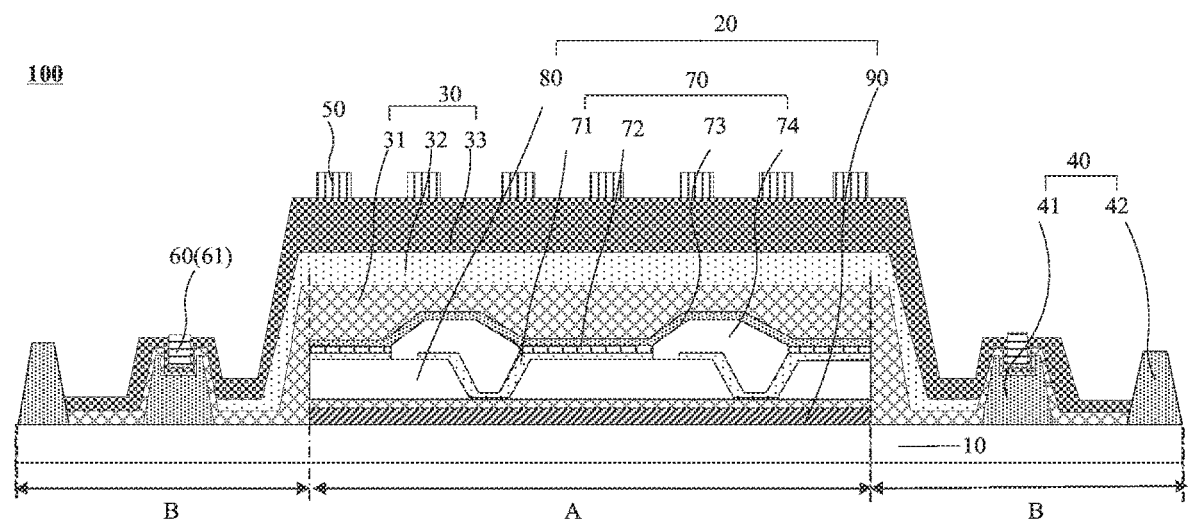
FIG. 6 is a schematic diagram illustrating a sectional structure of another touch display panel provided by embodiments of the present disclosure.

With reference to FIG. 6, FIG. 6 is a schematic diagram illustrating a sectional structure of another touch display panel provided by an embodiment of the present disclosure. In the present embodiment, the retaining wall 40 is provided with a groove, and at least a part of at least one of the electrode wires is arranged in the groove. The groove is arranged at the top of the retaining wall 40, and the groove cannot be completely filled up by the thin film encapsulation layer 30 on the retaining wall 40 because the thickness of the thin film encapsulation layer is small. Therefore, the electrode wires in the thin film encapsulation layer are also located in the retaining wall, thereby effectively preventing adjacent electrode wires from being in contact with each other to cause the phenomenon of short circuit. In an embodiment of the present disclosure, the touch display panel may be a self-capacitance touch display panel or a mutual capacitance touch display panel.

Figure 7:
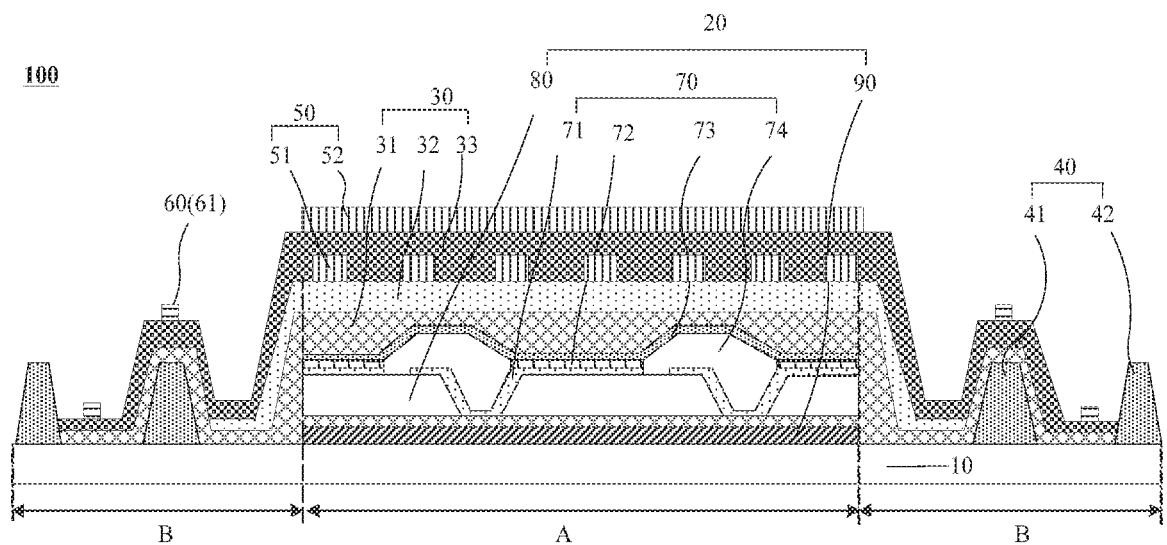
FIG. 7 is a schematic diagram illustrating a sectional structure of a mutual capacitance touch display panel provided by embodiments of the present disclosure.

With reference to FIG. 7, FIG. 7 is a schematic diagram illustrating a sectional structure of a mutual capacitance touch display panel provided by an embodiment of the present disclosure. The mutual capacitance touch display panel includes first electrodes 51 and second electrodes 52. The first electrodes 51 and the second electrodes 52 are arranged at different layers and are intersected. The first electrodes 51 are arranged between the organic encapsulation layer 32 and the second inorganic encapsulation layer 33, and the second electrodes 52 are arranged at the side, which is facing away from the substrate 10, of the second inorganic encapsulation layer 33. A mutual capacitor is formed between a column of longitudinally arranged first electrodes 51 and a column of horizontally arranged second electrodes 52, so as to realize a touch function. Each of the first electrodes 51 and each of the second electrodes 52 are respectively connected with the touch electrode wires 61, and touch signals are transmitted to a detecting chip (not shown) through the touch electrode wires 61.

Figure 8:
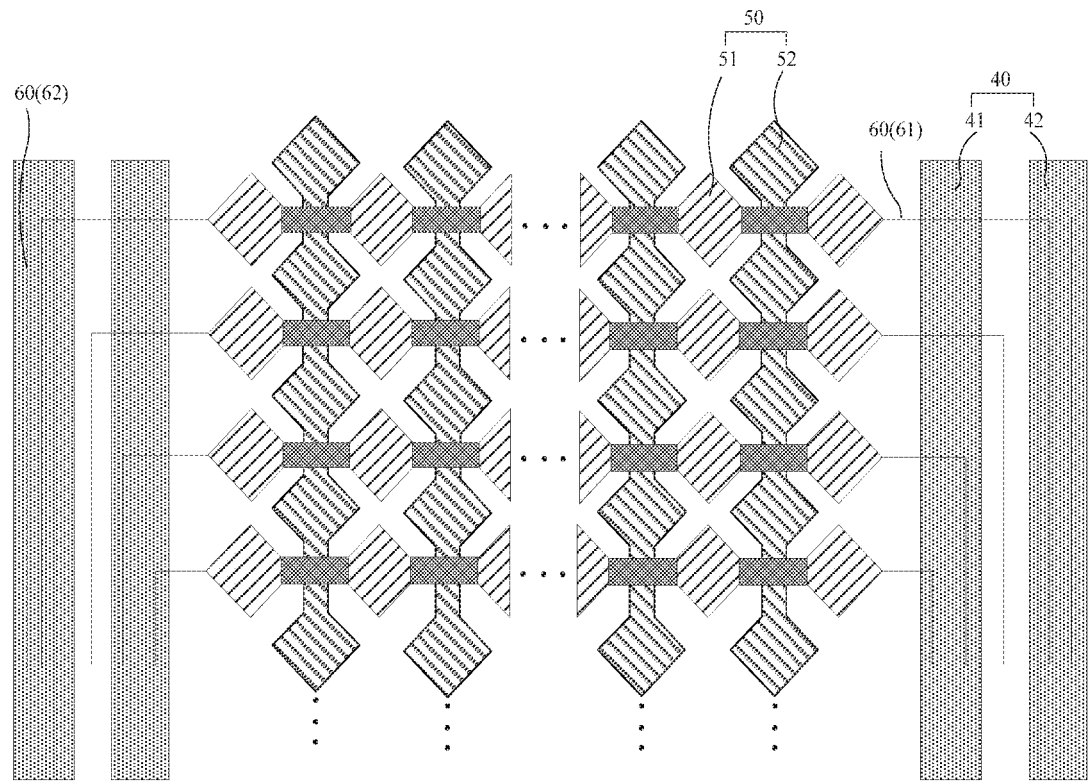
FIG. 8 is a schematic top diagram illustrating a structure of another mutual capacitance touch display panel provided by embodiments of the present disclosure.

With reference to FIG. 8, FIG. 8 is a schematic top diagram illustrating a structure of another mutual capacitance touch display panel provided by an embodiment of the present disclosure. The mutual capacitance touch display panel includes first electrodes 51 and second electrodes 52. The first electrodes 51 and the second electrodes 52 are arranged at a same layer and are intersected, each of the first electrodes 51 and each of the second electrodes 52 are electrically insulated from each other, and the first electrodes 51 are connected via crossing bridges. A capacitor is formed at positions where the two groups of electrodes are intersected, namely, the two groups of electrodes respectively form two electrodes of the capacitor. Coupling between the two electrodes near a touch point is influenced when a finger touches a capacitance screen, and capacitance between the two electrodes is changed. The electrodes horizontally arranged sequentially send excitation signals, and all the electrodes longitudinally arranged receive the signals simultaneously, so as to obtain the size of the capacitance at intersection points of all the electrodes horizontally and longitudinally arranged, i.e., the size of the capacitance of the whole touch screen in two-dimensional plane. A coordinate of each touch point can be calculated according to variation data of the two-dimensional capacitance of the touch screen. Therefore, a true coordinate of each touch point can also be calculated even if a plurality of touch points exist on the screen. The touch electrode wires 61 are connected with the touch electrodes 50, so as to transmit touch signals, and at least a part of at least one of the touch electrode wires 61 is arranged on the retaining wall 40. Optionally, the first electrodes 51 and the second electrodes 52 may be arranged between the organic encapsulation layer 32 and the second inorganic encapsulation layer 33, or be arranged at the side, which is facing away from the substrate 10, of the second inorganic encapsulation layer 33. Those skilled in the art can set the positions of the first electrodes 51 and the second electrodes 52 according to actual needs, which are not limited herein by the present disclosure.

Figure 9:
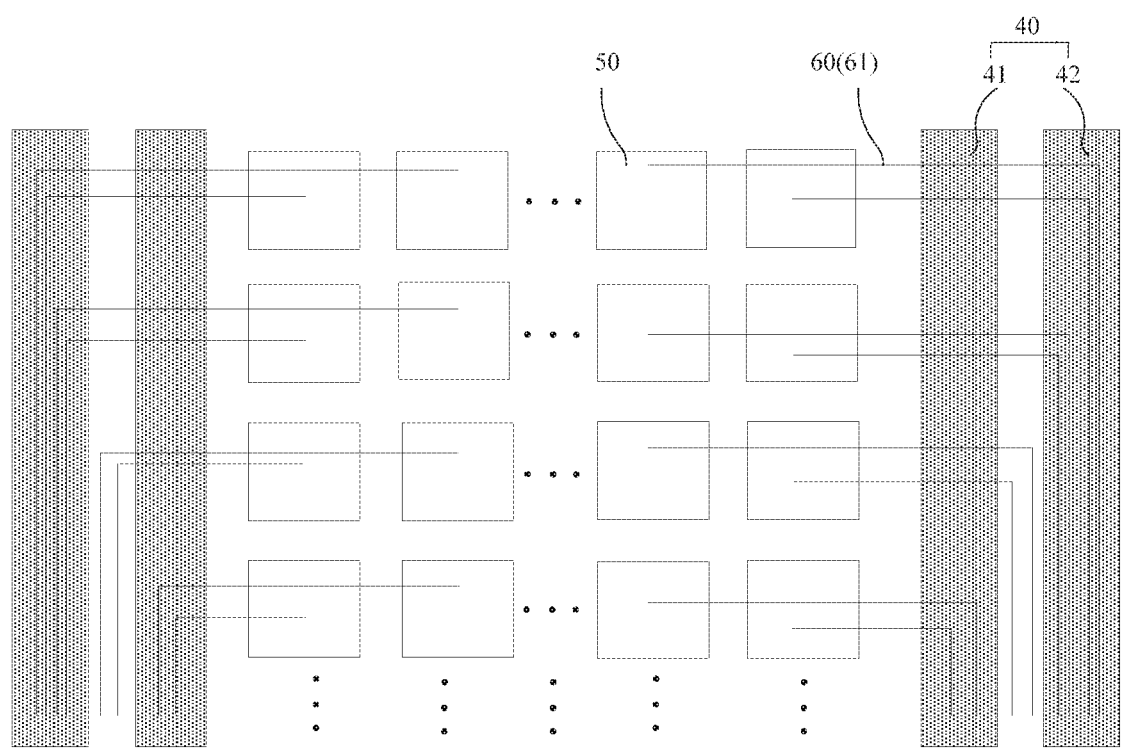
FIG. 9 is a schematic top diagram illustrating a structure of a self-capacitance touch display panel provided by embodiments of the present disclosure.

With reference to FIG. 9, FIG. 9 is a schematic top diagram illustrating a structure of a self-capacitance touch display panel provided by an embodiment of the present disclosure. The self-capacitance touch display panel includes touch electrodes 50 which are self-capacitance electrodes, and the touch electrodes 50 are connected with touch electrode wires 61. Specifically, the self-capacitance touch display panel includes a plurality of touch electrodes 50 which are arranged in an array manner, and each of the touch electrodes is connected with a detecting chip (not shown) via one touch electrode wire. The capacitance of each of touch electrodes 50 is a constant value when a finger does not touch a touchable area of the touch display panel, while the capacitance of the touch electrode 50 at a touch point is a superposition of the constant value and body capacitance of a person when the person touches the touchable area of the touch display panel with his fingers. Therefore, the touch display panel can determine the position of the touch point according to a change of the self-capacitance, so as to carry out a corresponding display. Optionally, in the embodiment of the present disclosure, the first electrodes 51 and second electrodes 52 may be arranged between the organic encapsulation layer 32 and the second inorganic encapsulation layer 33, or arranged at the side, which is facing away from the substrate 10, of the second inorganic encapsulation layer 33. Those skilled in the art can set the positions of the first electrodes 51 and the second electrodes 52 according to actual needs, which are not limited herein by the present disclosure.

Figure 10:
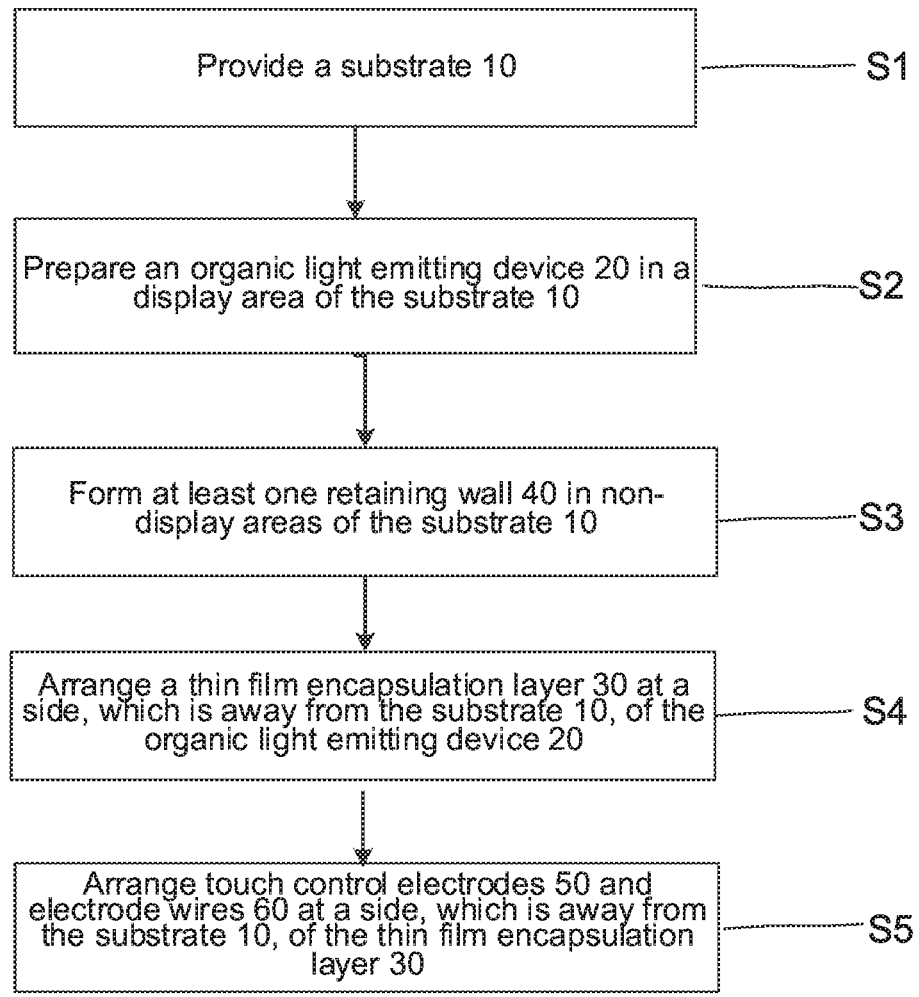
FIG. 10 is a flow chart illustrating steps of preparing a touch display panel provided by embodiments of the present disclosure.

Materials of the touch electrodes 50 and touch electrode wires 60 may be any one of tin indium oxide, metal meshes, metal nano materials, graphene, conductive macromolecules and carbon nano tubes. The touch electrodes and the electrode wires are formed by any one of an ink jet printing process, a silk-screen printing process and a laser etching process. The touch electrodes 50 may be block electrodes in a rectangular shape, a rhombus shape and the like, which is not limited by embodiments of the present disclosure. Optionally, the touch electrodes 50 may also be the metal meshes, so as to reduce the resistance and improve the optical effect. The touch display panel of embodiments of the present disclosure can be prepared by a method below, which is shown in FIG. 10.

In S1, a substrate 10 including a display area A and non-display areas B is provided.

It should be noted that, in the case that the substrate 10 is a flexible substrate, a rigid carrier is required to form the flexible substrate. The rigid carrier may be a glass substrate or a quartz substrate, and the flexible substrate is prepared on the glass substrate or the quartz substrate by means of spin-coating and the like.

In S2, an organic light emitting device 20 is formed in the display area A of the substrate 10.

Figure 11A:
FIGS. 11*a*-11*d* are schematic diagrams illustrating a structure of a touch display panel during a flow of preparing the touch display panel provided by embodiments of the present disclosure.
Figure 11B:
Figure 11C:
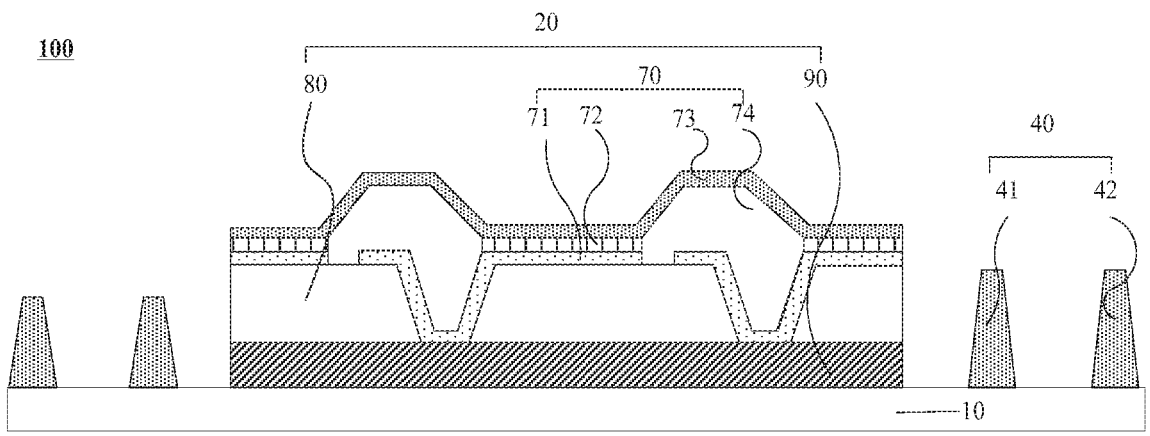

The organic light emitting device 20 is formed through the following steps: with reference to FIG. 11b and FIG. 11c, a thin film transistor layer 90, a metal layer including a plurality of data lines (not shown) and a metal layer including a plurality of scanning lines (not shown) are formed on the substrate 10. The thin film transistor layer 90 includes at least an active layer, a source, a drain, a gate and an insulating layer, and the drain of the thin film transistor layer 90 is electrically connected with an anode layer 71 of the organic light emitting device 20. The metal layer including the plurality of data lines and the metal layer including the plurality of scanning lines are intersected with each other, the metal layer including the plurality of data lines is electrically connected with the source of the thin film transistor layer 90, and the metal layer including the plurality of scanning lines is electrically connected with the gate of the thin film transistor layer 90. With reference to FIG. 11c, a planarization layer 80 is formed on the thin film transistor layer 90, and the planarization layer 80 is etched to form a groove. The anode layer 71, a pixel definition layer 74, a light emitting layer 72 and a cathode layer 73 are sequentially formed on the planarization layer, so as to form a device layer 70. The anode layer 71 of the device layer 70 is located on the planarization layer 80 and is electrically connected with the drain of the thin film transistor layer 90 through a via hole in the planarization layer 80. The device layer 70 may also further include one or more of a hole injection layer, a hole transport layer, an electron blocking layer, a hole blocking layer, an electron transport layer and an electron injection layer. One or more of the hole injection layer, the hole transport layer and the electron blocking layer may be prepared between the anode layer 71 and the light emitting layer 72, and one or more of the hole blocking layer, the electron transport layer and the electron injection layer may be prepared between the light emitting layer 72 and the cathode layer 73.

In S3, at least one retaining wall 40 is formed in the non-display areas B of the substrate 10. The retaining walls include a first retaining wall adjacent to the display area A, and the width of the retaining walls is 30~200 μm.

Optionally, with reference to FIG. 11c, at least one retaining wall 40 is formed in the non-display areas B of the substrate in the process of forming the planarization layer 80 and the pixel definition layer 74. The width of the retaining wall 40 may be 30~200 μm. Optionally, the width of the retaining wall may be 60~70 μm, and an inclination angle of the retaining wall may be 10~30 degrees.

In S4, a thin film encapsulation layer 30 is arranged at a side, which is facing away from the substrate 10, of the organic light emitting device 20. The thin film encapsulation layer 30 includes at least one inorganic encapsulation layer and at least one organic encapsulation layer, and covers at least one retaining wall 40, and a height difference h2 between the retaining wall 40 and a part of the thin film encapsulation layer 30 located between the first retaining wall 41 and the display area A is 0~3 μm.

In S5, touch electrodes 50 and electrode wires 60 are arranged at the side, which is facing away from the substrate 10, of the thin film encapsulation layer, and at least a part of at least one of the touch electrodes 50 is located in the display area of the substrate 10. In order that a border area has a better touch effect, the touch electrodes 50 can be properly expanded to the non-display areas B when the touch electrodes 50 are prepared. At least a part of at least one of the electrode wires 60 is located in the non-display areas B of the substrate 10, located at the side, which is facing away from the retaining wall 40, of the thin film encapsulation layer 30, and is arranged along the extension direction of the retaining wall(s) 40. The projections of the electrode wires 60 on the substrate 10 are in the projection of the retaining wall 40 on the substrate 10. Optionally, the electrode wires 60 may include touch electrode wires 61 which are electrically connected with the touch electrodes 50. The electrode wires 60 may further include grounding wires 62, the grounding wires 62 and the touch electrode wires 61 may be prepared by a same preparation process.

Optionally, materials of the touch electrodes 50 and the electrode wires 60 may be any one of tin indium oxide, metal meshes, metal nano materials, graphene, conductive macromolecules and carbon nano tubes. The touch electrodes and the electrode wires are formed by any one of an ink jet printing process, a silk-screen printing process and a laser etching process. The touch electrodes 50 may be block electrodes in a rectangular shape, a rhombus shape and the like, which are not limited by embodiments of the present disclosure. Optionally, the touch electrodes 50 may also be the metal meshes, so as to reduce the resistance and improve the optical effect.

In embodiments of the present disclosure, the width of the retaining wall 40 may be 30~200 μm, so that all the electrode wires 60 can be arranged on the retaining wall 40. Optionally, the width of the retaining wall 40 may be 60~70 μm, so that at least a part of at least one of the electrode wires 60 can be arranged on the retaining wall 40, so as to achieve the narrow border. Optionally, the height of the retaining wall may be 4~6 μm, so that the electrode wires can better cross the retaining wall 40 without breaking. Optionally, the height difference h2 between the retaining wall 40 and a part of the thin film encapsulation layer 30 located between the first retaining wall 41 and the display area A is 0~3 μm, thereby reducing climbing obstruction of the electrode wires. Optionally, the inclination angle of the retaining wall may be in a range of 10~30 degrees. The inventor found through a large number of experiments that, by setting the inclination angle α of the retaining wall 40 in such a range, the touch electrodes can be well arranged on the retaining wall 40. Therefore, wire breaking is not caused, the rate of being good is higher, the limitation function on the organic encapsulation layer can be better kept, and the crack expansion on the boundary can be well prevented. Optionally, the retaining wall 40 includes the first retaining wall 41 and a second retaining wall 42. Optionally, the retaining wall is also etched to form a groove, so that the electrode wires can be located in the grooves, thereby preventing adjacent electrode wires from being in contact with each other to cause short circuit when the retaining wall is prepared.

Figure 11D:
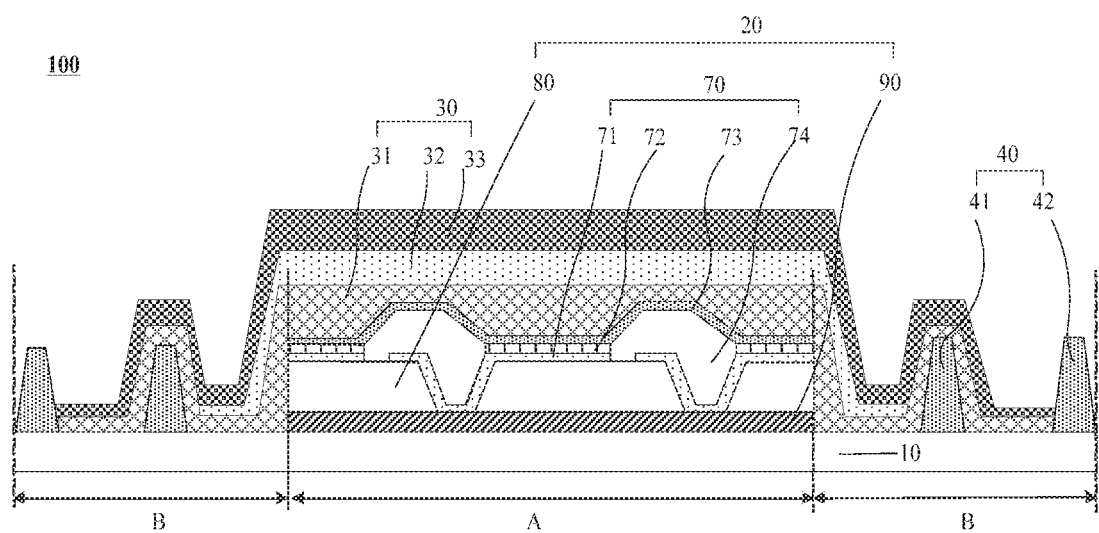

Optionally, the thin film encapsulation layer 30 is formed at the side, which is facing away from the substrate 10, of the organic light emitting device 20, and the thin film encapsulation layer 30 includes at least one organic encapsulation layer and at least one inorganic encapsulation layer. Optionally, with reference to FIG. 11*d*, the thin film encapsulation layer 30 sequentially includes a first inorganic encapsulation layer 31, an organic encapsulation layer 32 and a second inorganic encapsulation layer 33. The first inorganic encapsulation layer 31 is formed at the side, which is facing away from the substrate 10, of the organic light emitting device 20; the organic encapsulation layer 32 is arranged at the side, which is facing away from the substrate 10, of the first inorganic encapsulation layer 31, and the second inorganic encapsulation layer 33 is formed at the side, which is facing away from the substrate, of the organic encapsulation layer 32, where the thin film encapsulation layer 30 covers at least one retaining wall 40. Optionally, in embodiments of the present disclosure, the inorganic encapsulation layer may be formed by a chemical vapor deposition process, and the organic encapsulation layers may be formed by an ink jet printing process.

Optionally, the touch display panel of embodiments of the present disclosure may be a self-capacitance touch display panel, and may include first electrodes 51 and second electrodes 52 which are arranged at a same layer and intersected in an insulation manner. The second electrodes are connected by crossing bridges. The first electrodes and the second electrodes can be prepared at the side, which is facing away from the substrate, of the second inorganic encapsulation layer 33 after the second inorganic encapsulation layer 33 is prepared. Optionally, the first electrodes 51 and the second electrodes 52 can be prepared after the organic encapsulation layer 32 is prepared.

Optionally, the self-capacitance touch display panel of embodiments of the present disclosure may also include first electrodes 51 and second electrodes 52 which are arranged at different layers and intersected in an insulation manner. The first electrodes 51 are prepared after the organic encapsulation layer 32 is prepared, and the second electrodes 52 are prepared after the second inorganic encapsulation layer 33 is prepared.

Optionally, the touch display panel of embodiments of the present disclosure may be a self-capacitance touch display panel and includes a plurality of touch electrodes 61 arranged in an array manner. The touch electrodes 61 may be prepared after the organic encapsulation layer 32 is prepared or after the second inorganic encapsulation layer 33 is prepared, which are not limited by the present disclosure.

In the preparation method of the display panel provided by embodiments of the present disclosure, at least a part of at least one of the electrode wires 60 is arranged on the retaining wall, thereby fully utilizing the width of the border area to realize the narrow border.

Figure 12:
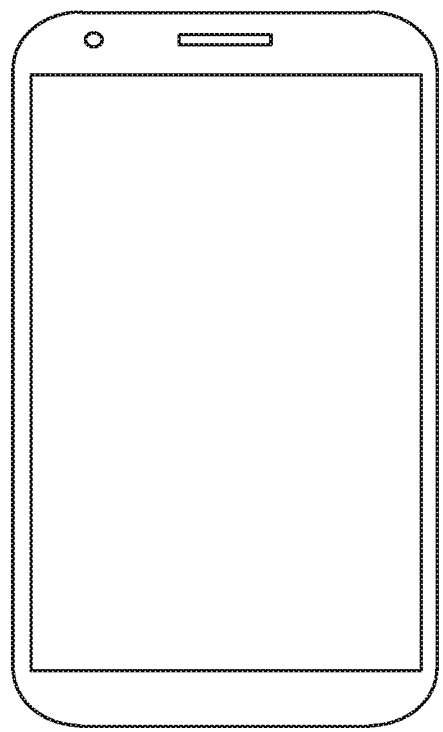
FIG. 12 is a schematic diagram illustrating a touch display apparatus provided by embodiments of the present disclosure.

An embodiment of the present disclosure further provides a touch display apparatus 200. FIG. 12 is a schematic diagram illustrating the touch display apparatus provided by an embodiment of the present disclosure. As shown in FIG. 12, the touch display apparatus includes the touch display panel 100 according to any of above embodiments. Optionally, the touch display apparatus provided by the present embodiment of the present disclosure may be an organic light emitting touch display apparatus. The touch display apparatus provided by the present embodiment of the present disclosure includes the touch display panel according to any of above embodiments. Therefore, the touch display apparatus provided by the present embodiment of the present disclosure also has the beneficial effects described in above embodiments, which are not repeated again.

In the present embodiment of the present disclosure, the width of at least one retaining wall is set as 30~200 μm, so that at least a part of at least one of the electrode wires can be arranged in the non-display areas of the substrate, located at the side, which is facing away from the retaining wall, of the thin film encapsulation layer, and is arranged along the extension direction of the retaining wall, and the projections of the electrode wires on the substrate are in the projection of the retaining wall on the substrate, thereby fully utilizing the border area of the area where the retaining wall is located and reducing the border area where the electrode wires are individually placed, so as to realize the narrow border. In addition, the height difference between the retaining wall 40 and a part of the thin film encapsulation layer 30 located between the first retaining wall 41 and the display area A is 0~3 μm, thereby alleviating the risks of wire breaking and short circuit of the electrode wires caused by climbing.

The above contents are further detailed descriptions of the present disclosure in combination with specific preferred implementation manners, and it cannot be identified that the specific implementation of the present disclosure is only limited to the descriptions. Those ordinary skilled in the technical field of the present disclosure can also make several simple deductions or replacements on the premise of not departing from the concept of the present disclosure, which should be regarded to belong to the protection scope of the present disclosure.

What is claimed is:

1. A touch display panel, comprising:
a substrate comprising a display area and non-display areas;
an organic light emitting device formed in the display area of the substrate;
at least one retaining wall arranged in the non-display areas of the substrate, wherein the at least one retaining wall comprises a first retaining wall which is adjacent to the display area, and a width of the at least one retaining wall is greater than or equal to 30 µm and less than or equal to 200 µm;
a thin film encapsulation layer, wherein the thin film encapsulation layer is arranged on the organic light emitting device, and the thin film encapsulation layer comprises at least one inorganic encapsulation layer and at least one organic encapsulation layer, and the thin film encapsulation layer covers the at least one retaining wall, a height difference between the first retaining wall and a part of the thin film encapsulation layer located between the first retaining wall and the display area is greater than or equal to 0 µm and less than or equal to 3 µm;
touch electrodes, wherein the touch electrodes are arranged on the thin film encapsulation layer, and at least a part of at least one of the touch electrodes is located in the display area of the substrate; and
electrode wires, wherein at least a part of at least one of the electrode wires is located in the non-display area of the substrate, is disposed on the thin film encapsulation layer, and is arranged along an extension direction of the at least one retaining wall, wherein projections of the electrode wires on the substrate are located within a projection of the at least one retaining wall on the substrate.

2. The touch display panel according to claim 1, wherein the electrode wires comprise touch electrode wires, at least a part of at least one of the touch electrode wires is located in the non-display area of the substrate, and the touch electrode wires are connected with the touch electrodes.

3. The touch display panel according to claim 1, wherein the electrode wires further comprise a grounding wire.

4. The touch display panel according to claim 1, wherein a height of the at least one retaining wall is greater than or equal to 4 µm and less than or equal to 6 µm.

5. The touch display panel according to claim 1, wherein a width of the at least one retaining wall is greater than or equal to 60 µm and less than or equal to 70 µm.

6. The touch display panel according to claim 1, wherein an inclination angle of the at least one retaining wall is greater than or equal to 10 degrees and less than or equal to 30 degrees.

7. The touch display panel according to claim 1, wherein the at least one retaining wall comprises at least two retaining walls and the electrode wires are arranged between the two retaining walls.

8. The touch display panel according to claim 7, wherein one of the electrode wires is arranged between the two retaining walls.

9. The touch display panel according to claim 1, wherein all the electrode wires are arranged on the first retaining wall.

10. The touch display panel according to claim 1, wherein materials of the touch electrodes and the electrode wires are any one of tin indium oxide, metal meshes, metal nano materials, graphene, conductive macromolecules and carbon nano tubes.

11. The touch display panel according to claim 1, wherein the touch electrodes and the electrode wires are formed by any one of an ink jet printing process, a silk-screen printing process, a laser etching process and a wet etching process.

12. The touch display panel according to claim 1, wherein a groove is arranged on each of the at least one retaining wall, and the at least a port of at least one of the electrode wires is located in the groove.

13. The touch display panel according to claim 1, wherein the touch display panel is a self-capacitance touch display panel.

14. The touch display panel according to claim 13, wherein a first inorganic encapsulation layer, an organic encapsulation layer and a second inorganic encapsulation layer are sequentially arranged on the organic light emitting device.

15. The touch display panel according to claim 14, wherein the touch electrodes comprise first touch electrodes and second touch electrodes, the first touch electrodes and the second touch electrodes are prepared at a same layer and are intersected and insulated from each other, and the first touch electrodes are connected by crossing bridges.

16. The touch display panel according to claim 15, wherein the touch electrodes are arranged on the second inorganic encapsulation layer, or arranged between the organic encapsulation layer and the second inorganic encapsulation layer.

17. The touch display panel according to claim 14 wherein the touch electrodes comprises first touch electrodes and second touch electrodes, the first touch electrodes and the second touch electrodes are arranged at different layers and are insulated from each other, the first touch electrodes are arranged between the organic encapsulation layer and the second inorganic encapsulation layer, and the second touch electrodes are arranged on the second inorganic encapsulation layer.

18. The touch display panel according to claim 1, wherein the touch display panel is a mutual capacitance touch display panel.

19. The touch display panel according to claim 1, wherein the organic light emitting device sequentially comprises a planarization layer, a thin film transistor layer and a device layer at a side toward the thin film encapsulation layer of the substrate.

20. A touch display apparatus comprising a touch display panel, wherein the touch display panel comprises:
a substrate comprising a display area and non-display areas;
an organic light emitting device formed in the display area of the substrate;
at least one retaining wall arranged in the non-display areas of the substrate, wherein the at least one retaining wall comprises a first retaining wall which is adjacent to the display area, and a width of the at least one retaining wall is greater than or equal to 30 µm and less than or equal to 200 µm;
a thin film encapsulation layer, wherein the thin film encapsulation layer is arranged on the organic light emitting device, and the thin film encapsulation layer comprises at least one inorganic encapsulation layer and at least one organic encapsulation layer, and the thin film encapsulation layer covers the at least one retaining wall, a height difference between the first retaining wall and a part of the thin film encapsulation layer located between the first retaining wall and the display area is greater than or equal to 0 µm and less than or equal to 3 µm;

touch electrodes, wherein the touch electrodes are arranged on the thin film encapsulation layer, and at least a part of at least one of the touch electrodes is located in the display area of the substrate; and electrode wires, wherein at least a part of at least one of the electrode wires is located in the non-display area of the substrate, is disposed on the thin film encapsulation layer, and is arranged along an extension direction of the at least one retaining wall, wherein projections of the electrode wires on the substrate are located within a projection of the at least one retaining wall on the substrate.

* * * * *